United States Patent
Kim et al.

(10) Patent No.: US 8,462,023 B2
(45) Date of Patent: Jun. 11, 2013

(54) ENCODING METHOD AND ENCODING APPARATUS FOR B-TRANSFORM, AND ENCODED DATA FOR SAME

(75) Inventors: Hayoon Kim, Gyeonggi-do (KR); Yoonsik Choe, Gyeonggi-do (KR); Yonggoo Kim, Seoul (KR); Yungho Choi, Gyeonggi-do (KR); Sungjei Kim, Seoul (KR); Jinwoo Jung, Seoul (KR)

(73) Assignee: SK Telecom Co., Ltd., Seoul (KR)

( * ) Notice: Subject to any disclaimer, the term of this patent is extended or adjusted under 35 U.S.C. 154(b) by 118 days.

(21) Appl. No.: 13/063,784

(22) PCT Filed: Sep. 9, 2009

(86) PCT No.: PCT/KR2009/005095
§ 371 (c)(1),
(2), (4) Date: May 5, 2011

(87) PCT Pub. No.: WO2010/032934
PCT Pub. Date: Mar. 25, 2010

(65) Prior Publication Data
US 2011/0210875 A1    Sep. 1, 2011

(30) Foreign Application Priority Data

Sep. 16, 2008 (KR) .................. 10-2008-0090799
Sep. 18, 2008 (KR) .................. 10-2008-0091578

(51) Int. Cl.
*H03M 7/00* (2006.01)

(52) U.S. Cl.
USPC ................. 341/50; 341/51; 341/106; 341/107

(58) Field of Classification Search
USPC .................... 341/50, 51, 107, 106
See application file for complete search history.

(56) References Cited

U.S. PATENT DOCUMENTS

| | | | | |
|---|---|---|---|---|
| 5,539,842 A | * | 7/1996 | Schwartz | ............... 382/232 |
| 5,550,540 A | * | 8/1996 | Furlan et al. | ............... 341/51 |
| 5,903,676 A | | 5/1999 | Wu et al. | |
| 5,933,105 A | * | 8/1999 | Cho | ............... 341/107 |
| 6,549,148 B2 | * | 4/2003 | Satoh | ............... 341/51 |
| 6,927,710 B2 | | 8/2005 | Linzer et al. | |

FOREIGN PATENT DOCUMENTS

| | | |
|---|---|---|
| EP | 1400954 | 3/2004 |
| KR | 1020040047643 | 6/2004 |
| KR | 1020050090941 | 9/2005 |

OTHER PUBLICATIONS

International Search Report mailed Apr. 29, 2010 for PCT/KR2009/005095.

\* cited by examiner

*Primary Examiner* — Jean B Jeanglaude
(74) *Attorney, Agent, or Firm* — Lowe Hauptman Ham & Berner, LLP

(57) ABSTRACT

An encoding method and encoding apparatus for B-transform, and encoded data for same are provided. The apparatus is for encoding input data and includes: a B-transform unit for performing a B-transform on the input data to generate a binary expression; and an encoder for removing one or more binary symbols from the binary expression and scanning the binary expression with the one or more binary symbols removed to generate a bitstream. According to the method and apparatus, it is possible to encode uniform distribution data efficiently, and using the B-transform by its characteristics for reducing the bit number in the generation of the binary expressions from the B-transform operation on the uniform distribution data enhances the data compression performance.

30 Claims, 18 Drawing Sheets

| PROPERTY 1 | $\tilde{D}^i$ GENERATED FROM $i$TH B-TRANSFORM ON $X$ ALWAYS SATISFIES $\tilde{D}^i(j)=0$ $(n-i \leq j<n)$. |
|---|---|
| PROPERTY 2 | IF $\tilde{D}^i(j)=0$, $\tilde{D}^{i+1}(j-1)=0$. |
| PROPERTY 3 | IF $\tilde{D}^i(j)=1$, $\tilde{D}^{i-1}(j+1)=1$. |

*FIG. 2*

| | $\tilde{D}$ | | | | | | | | | | | | | | |
|---|---|---|---|---|---|---|---|---|---|---|---|---|---|---|---|
| | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| $\tilde{D}^1$ | 0 | 1 | 1 | 0 | 0 | 0 | 1 | 1 | 1 | 0 | 1 | 1 | 1 | 1 | 1 |
| $\tilde{D}^2$ | 0 | 1 | 0 | 0 | 0 | 1 | 1 | 1 | 0 | 1 | 1 | 1 | 1 | 1 | |
| $\tilde{D}^3$ | 1 | 0 | 0 | 0 | 1 | 1 | 1 | 0 | 1 | 1 | 1 | 0 | 1 | | |
| $\tilde{D}^4$ | 0 | 0 | 0 | 0 | 1 | 1 | 0 | 1 | 1 | 1 | 0 | 0 | | | |
| $\tilde{D}^5$ | 0 | 0 | 0 | 0 | 1 | 0 | 1 | 0 | 0 | 0 | 0 | | | | |
| $\tilde{D}^6$ | 0 | 0 | 0 | 0 | 0 | 1 | 0 | 0 | 0 | 0 | | | | | |
| $\tilde{D}^7$ | 0 | 0 | 0 | 0 | 1 | 0 | 0 | 0 | 0 | | | | | | |
| $\tilde{D}^8$ | 0 | 0 | 0 | 1 | 0 | 0 | 0 | 0 | | | | | | | |

*FIG. 4*

|  | $\tilde{D}$ | | | | | | | | | | | | | | |
|---|---|---|---|---|---|---|---|---|---|---|---|---|---|---|---|
|  | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| $\tilde{D}^1$ | 0 | 1 | 1 | 0 | 0 | 0 | 1 | 1 | 1 | 0 | 1 | 1 | 1 | 1 | 1 |
| $\tilde{D}^2$ | 0 | 1 |   |   |   | 1 | 1 | 1 |   | 1 | 1 | 1 | 1 | 1 |   |
| $\tilde{D}^3$ | 1 |   |   |   | 1 | 1 | 1 |   | 1 | 1 | 1 | 0 | 1 |   |   |
| $\tilde{D}^4$ |   |   |   | 0 | 1 | 1 |   | 1 | 1 | 1 |   | 0 |   |   |   |
| $\tilde{D}^5$ |   |   |   | 0 | 1 |   | 1 | 0 | 0 |   |   |   |   |   |   |
| $\tilde{D}^6$ |   |   |   | 0 |   | 1 |   |   |   |   |   |   |   |   |   |
| $\tilde{D}^7$ |   |   |   | 1 |   |   |   |   |   |   |   |   |   |   |   |
| $\tilde{D}^8$ |   |   |   | 1 |   |   |   |   |   |   |   |   |   |   |   |

FIG. 5

|           | $\widetilde{D}$ |       |       |       |       |       |       |       |       |          |          |          |          |          |          |
|-----------|-------|-------|-------|-------|-------|-------|-------|-------|-------|----------|----------|----------|----------|----------|----------|
|           | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| $\widetilde{D}^1$ | 0 | 1 | 1 | 0 | 0 | 0 | 1 | 1 | 1 | 0 | 1 | 1 | 1 | 1 | 1 |
| $\widetilde{D}^2$ | 0 | 1 |   |   |   | 1 | 1 | 1 |   | 1 | 1 | 1 |   | 1 | 1 |
| $\widetilde{D}^3$ | 1 |   |   |   |   | 1 | 1 | 1 |   | 1 | 1 | 1 | 0 | 1 |   |
| $\widetilde{D}^4$ |   |   |   | 0 | 1 | 1 | 1 |   | 1 | 1 | 1 |   | 0 |   |   |
| $\widetilde{D}^5$ |   |   |   | 0 | 1 |   | 1 | 0 | 0 |   |   |   |   |   |   |
| $\widetilde{D}^6$ |   |   |   | 0 | 1 |   |   |   |   |   |   |   |   |   |   |
| $\widetilde{D}^7$ |   |   |   |   | 1 |   |   |   |   |   |   |   |   |   |   |
| $\widetilde{D}^8$ |   |   |   | 1 |   |   |   |   |   |   |   |   |   |   |   |

*FIG. 6*

| | $\tilde{D}$ | | | | | | | | | | | | | | |
|---|---|---|---|---|---|---|---|---|---|---|---|---|---|---|---|
| | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| bit | 1 | 2 | 2 | 3 | 3 | 3 | 3 | 4 | 4 | 4 | 4 | 4 | 4 | 4 | 4 |

*FIG. 7*

| $M_x=8$ | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
|---|---|---|---|---|---|---|---|---|---|---|---|---|---|---|---|
| REQUIRED NUMBER OF BITS FOR ENCODING THE NUMBER OF '1'S | 1 | 2 | 2 | 3 | 3 | 3 | 3 | 4 | 4 | 4 | 4 | 4 | 4 | 4 | 4 |
| NUMBER OF 1S | 0 | 1 | 3 | 0 | 0 | 0 | 3 | 4 | 5 | 0 | 8 | 4 | 4 | 2 | 3 |
| BINARY EXPRESSION | 1 | 01 | 11 | 000 | 000 | 000 | 011 | 0100 | 0101 | 0000 | 1000 | 0100 | 0100 | 0010 | 0011 |

FIG. 8

| $M_x$ | BINARY EXPRESSION OF $M_x$ | REDUCIBLE BITS (UNDERLINED) | NOTE |
|---|---|---|---|
| 8 | 1000 | 1000 | |
| 9 | 1001 | 1001 | |
| 10 | 1010 | 1010 | IF 1ST MSB AND 3RD MSB ARE BOTH 1, 1010 |
| 11 | 1011 | 1011 | |
| 12 | 1100 | 1100 | IF 1ST MSB AND 2ND MSB ARE BOTH 1, 1100 |
| 13 | 1101 | 1101 | IF 1ST MSB AND 2ND MSB ARE BOTH 1, 1100 |
| 14 | 1110 | 1110 | IF 1ST MSB, 2ND MSB, AND 3RD MSB ARE ALL 1, 1110 |
| 15 | 1111 | 1111 | |

*FIG. 9*

| K | ~3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|
| n | 0 | 1 | 1 | 1 | 1 | 1 | 1 | 1 | 1,2 | 1,2 | 1,2 | 1,2 | 1,2 | 1~3 | 1,2 |
| K | 18 | 19 | 20 | 21 | 22 | 23 | 24 | 25 | 26 | 27 | 28 | 29 | 30 | 31 | 32 |
| n | 1,2 | 1~3 | 1~3 | 1~3 | 1~3 | 1~3 | 1~3 | 1~4 | 1~4 | 1~4 | 1~4 | 1~4 | 1~4 | 1~5 | 1~5 |

FIG. 10

|  | $\tilde{D}$ | | | | | | | | | | | | | | |
|---|---|---|---|---|---|---|---|---|---|---|---|---|---|---|---|
|  | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| $\tilde{D}^1$ | 0 | 1 |  | 0 | 0 | 0 |  |  |  | 0 |  |  |  |  |  |
| $\tilde{D}^2$ | 0 |  | 0 | 0 | 0 |  |  | 0 |  |  |  |  | 1 |  |  |
| $\tilde{D}^3$ | 1 | 0 | 0 | 0 | 1 |  |  | 0 |  |  |  | 0 | 1 |  |  |
| $\tilde{D}^4$ | 0 | 0 | 0 | 0 | 1 |  | 0 |  | 1 | 1 | 0 | 0 |  |  |  |
| $\tilde{D}^5$ | 0 | 0 | 0 | 0 | 1 | 0 |  | 0 | 0 | 0 | 0 |  |  |  |  |
| $\tilde{D}^6$ | 0 | 0 | 0 | 0 | 0 |  | 0 | 0 | 0 | 0 |  |  |  |  |  |
| $\tilde{D}^7$ | 0 | 0 | 0 | 0 |  | 0 | 0 | 0 | 0 |  |  |  |  |  |  |
| $\tilde{D}^8$ | 0 | 0 | 0 | 1 | 0 | 0 | 0 | 0 |  |  |  |  |  |  |  |

*FIG. 11*

|   | $\widetilde{D}$ | | | | | | | | | | | | | | |
|---|---|---|---|---|---|---|---|---|---|---|---|---|---|---|---|
|   | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ |
| $\widetilde{D}^1$ | 0 | 1 |   | 0 | 0 | 0 |   |   |   | 0 |   |   |   |   |   |
| $\widetilde{D}^2$ | 0 |   | 0 | 0 | 0 |   |   |   | 0 |   |   |   | 1 |   |   |
| $\widetilde{D}^3$ | 1 | 0 | 0 | 0 | 1 |   |   |   |   |   |   | 0 | 1 |   |   |
| $\widetilde{D}^4$ | 0 | 0 | 0 | 0 | 1 |   | 0 |   | 1 | 1 | 0 | 0 |   |   |   |
| $\widetilde{D}^5$ | 0 | 0 | 0 | 0 | 1 |   |   | 0 | 0 | 0 |   |   |   |   |   |
| $\widetilde{D}^6$ | 0 | 0 | 0 | 0 |   | 0 | 0 | 0 | 0 |   |   |   |   |   |   |
| $\widetilde{D}^7$ | 0 |   | 0 | 0 |   | 0 | 0 | 0 |   |   |   |   |   |   |   |
| $\widetilde{D}^8$ | 0 | 0 | 0 | 1 | 0 | 0 | 0 |   |   |   |   |   |   |   |   |

*FIG. 12*

| Bits | $Log_2 N$ | 1 | 1 | TB |
|------|-----------|---|---|------|
| Symbols | $M_x$ | MPS | RF | DATA |

*FIG. 13*

|     | $I_1$ | $I_2$ | $I_3$ | $I_4$ | $I_5$ | $I_6$ | $I_7$ | $I_8$ |
|-----|---|---|---|---|---|---|---|---|
| $d_{16}$ |   |   |   |   |   |   |   |   |
| $d_{15}$ | 1 |   |   |   |   |   |   |   |
| $d_{14}$ | 1 | 1 |   |   |   |   |   |   |
| $d_{13}$ | 1 | 1 | 1 |   |   |   |   |   |
| $d_{12}$ | 1 | 1 | 0 | 0 |   |   |   |   |
| $d_{11}$ | 1 | 1 | 1 |   |   |   |   |   |
| $d_{10}$ | 0 | 1 | 1 | 1 |   |   |   |   |
| $d_9$ | 1 |   | 1 | 1 | 0 |   |   |   |
| $d_8$ | 1 | 1 |   | 1 | 0 |   |   |   |
| $d_7$ | 1 | 1 | 1 |   | 1 |   |   |   |
| $d_6$ | 0 | 1 | 1 | 1 |   | 1 |   |   |
| $d_5$ | 0 |   | 1 | 1 | 1 |   | 1 |   |
| $d_4$ | 0 |   |   | 0 | 0 | 0 |   | 1 |
| $d_3$ | 1 |   |   |   |   |   |   |   |
| $d_2$ | 1 | 1 |   |   |   |   |   |   |
| $d_1$ | 0 | 0 | 1 |   |   |   |   |   |

*FIG. 16*

ENCODING METHOD AND ENCODING APPARATUS FOR B-TRANSFORM, AND ENCODED DATA FOR SAME

CROSS REFERENCE TO RELATED APPLICATION

This application claims the priority of Korean Patent Application No. 10-2008-0090799, filed on Sep. 16, 2008, and 10-2008-0091578, filed on Sep. 18, 2008, in the KIPO (Korean Intellectual Property Office), the disclosure of which are incorporated herein in their entirety by reference. Further, this application is the National Phase application of International Application No. PCT/KR2009/005095, filed Sep. 9, 2009, which designates the United States and was published in Korean. Each of these applications is hereby incorporated by reference in their entirety into the present application.

TECHNICAL FIELD

The present disclosure relates to an encoding method and apparatus for B-transform. More particularly, the present disclosure relates to a method and apparatus for compressing by encoding data in a way to effectively utilize storage medium and communication medium.

BACKGROUND ART

The statements in this section merely provide background information related to the present disclosure and may not constitute prior art.

Random data compressing techniques have been provided based on, among others, Huffman coding, arithmetic coding, run-length coding. In 1948, C. E. Shannon defined entropy suggesting the lower limit of effective symbol coding based on probability model, and the result close to the suggested lower limit can be attained by various encoding techniques such as Huffman coding and arithmetic coding that were subsequently proposed. Since these encoding techniques can obtain a higher encoding efficiency in the event that the probability is weighted on a smaller number of symbols by entropy theory, they are not capable of having higher encoding efficiency in case of encoding data of a uniform distribution.

As a solution to this problem, nonlinear B-transform (bubble-transform) techniques were suggested to increase the encoding efficiency on data having the probability model with a uniform distribution and probability unbiased to the smaller number of symbols. However, the suggested B-transform techniques merely mathematically induced the upper limit of data of the uniform distribution but failed to suggest a solution to effectively encode binary symbols ('0' and '1') that result from the nonlinear B-transform and thus could not provide an effective solution to the encoding operations. Therefore, there is a practical need to develop a technique to effectively encode the binary symbols generated from the nonlinear B-transform.

DISCLOSURE

Technical Problem

In order to solve the above described problem, the present disclosure has been made for compressing data in a way to increase the encoding efficiency and thereby improve the compression performance by transforming random data of the uniform distribution, analyzing the context of data based on which data is effectively compressed, and using the B-transform by its characteristics for reducing the bit number in the generation of the binary expressions from the B-transform operation on the uniform distribution data.

Technical Solution

One aspect of the present disclosure provides an apparatus for encoding input data including: a B-transform unit for performing a B-transform on the input data to generate a binary expression; and an encoder for removing at least one binary symbol from the binary expression and scanning the binary expression with the at least one binary symbol removed to generate a bitstream.

Another aspect of the present disclosure provides a method for encoding input data including: performing a B-transform on the input data to generate a binary expression; and performing an encoding by removing at least one binary symbol from the binary expression and scanning the binary expression with the at least one binary symbol removed to generate a bitstream.

Yet another aspect of the present disclosure provides encoded data generated from encoding input data by an encoding apparatus, the encoded data including: a step count field containing a B-transform step count; and a data field containing a bitstream generated by removing at least one binary symbol from and performing a scanning with respect to a binary expression generated from B-transforming the input data as much as the B-transform step count.

Yet another aspect of the present disclosure provides an apparatus for encoding input data based on contexts including: a context analyzer for analyzing a correlation between samples of data in binary symbol expression from the input data being transformed to determine a context of the samples; and an encoder for encoding the samples according to the context determined to generate a bitstream.

Yet another aspect of the present disclosure provides a method for encoding input data based on contexts including: analyzing a context by analyzing a correlation between samples of data in binary symbol expression from the input data being transformed to determine a context of the samples; and encoding the samples according to the context determined to generate a bitstream.

Yet another aspect of the present disclosure provides an apparatus for analyzing a context for encoding by selecting a sample for determining the context from a table for presenting samples in binary symbol expression from uniform distribution data, detecting a binary symbol of an upper right sample of the sample selected in the table, and determining the binary symbol detected, as a context of the sample selected.

Yet another aspect of the present disclosure provides a method for analyzing a context for encoding including: selecting a sample for determining the context from a table for presenting samples in binary symbol expression from uniform distribution data; detecting a binary symbol of an upper right sample of the sample selected in the table; and determining the binary symbol detected, as a context of the sample selected.

Advantageous Effects

According to the disclosure as described above, a context decision may be made by using the B-transform characteristics that the samples in binary expression generated by the nonlinear B-transform on the uniform distribution data involve a correlation between the diagonally positioned samples, whereby giving a more accurate context decision and accordingly an accurate update of the probability table for compressing the uniform distribution data with an increased compression efficiency, and using the B-transform by its characteristics for reducing the bit number in the generation of the binary expressions from the B-transform operation on the uniform distribution data enhances the data compression performance, obviating an extra computation so as to simplify the implementation of an encoding apparatus.

DESCRIPTION OF DRAWINGS

FIG. 2 is an exemplary diagram showing properties by which input data is B-transformed and encoded according to the first aspect;

FIG. 4 is an exemplary diagram showing a table formation by applying property 1 to the binary expressions from the B-transform according to the first aspect;

FIG. 5 is an exemplary diagram showing a table formation by applying property 2 to the binary expressions from the B-transform according to the first aspect;

FIG. 6 is an exemplary diagram showing a table formation by applying a property 2 to the binary expressions from the B-transform followed by a diagonal scanning according to the first aspect;

FIG. 7 is an exemplary diagram showing the required bit number for encoding in the case of diagonally encoding the binary expressions from the B-transform according to the first aspect;

FIG. 8 is an exemplary diagram showing a binary expression for encoding the number of '1's being read during the diagonal scanning according to the first aspect;

FIG. 9 is an exemplary diagram showing the bit number available for reduction by using a step count according to the first aspect;

FIG. 10 is an exemplary diagram showing a condition for reducing bits in encoding a sort identifier costing the maximum bit number according to the first aspect;

FIG. 11 is an exemplary diagram showing a table formation by applying property 3 to the binary expressions from the B-transform according to the first aspect;

FIG. 12 is an exemplary diagram showing a table formation by applying a property 3 to the binary expressions from the B-transform followed by a diagonal scanning according to the first aspect;

FIG. 13 is an exemplary diagram showing the structure of an encoded data by encoding the binary expressions from the B-transform according to the first aspect;

FIG. 16 is an exemplary diagram showing a table for presenting the binary expressions from the B-transform;

MODE FOR INVENTION

Figure 1:
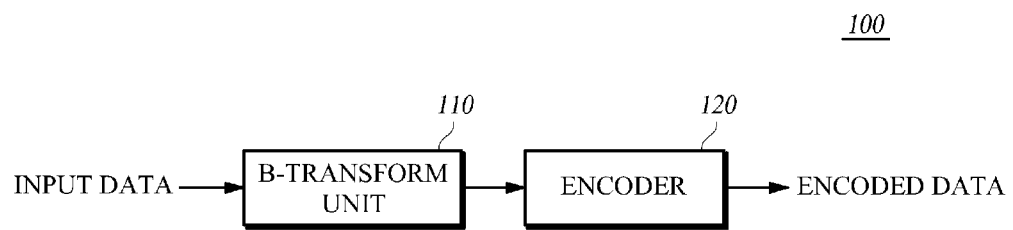
FIG. 1 is a block diagram of an encoding apparatus of a first aspect.

Hereinafter, aspects of the present disclosure will be described in detail with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Also, in describing the components of the present disclosure, there may be terms used like first, second, A, B, (a), and (b). These are solely for the purpose of differentiating one component from the other but not to imply or suggest the substances, order or sequence of the components. If a component were described as 'connected', 'coupled', or 'linked' to another component, they may mean the components are not only directly 'connected', 'coupled', or 'linked' but also are indirectly 'connected', 'coupled', or 'linked' via a third component.

FIG. 1 is a block diagram of an encoding apparatus 100 of a first aspect.

Encoding apparatus 100 may comprise a B-transform unit 110 and an encoder 120. Herein, encoding apparatus 100 may be a personal computer or PC, notebook or laptop computer, personal portable terminal such as personal digital assistant or PDA, portable multimedia player or PMP, PlayStation Portable or PSP, or mobile communication terminal, or such various devices for encoding data, and represent a variety of apparatuses equipped with, for example, a communication device such as a modem for carrying out communications between various devices or wired/wireless communication networks, a memory for storing various programs for encoding data and storing data, and a microprocessor for executing the programs to effect operations and controls.

B-transform unit 110 performs the B-transform on input data to generate binary expressions. Here, the input data may be the uniform distribution data, and the B-transform is a technique for effectively encoding the uniform distribution data by performing data transform into binary expressions.

Encoder 120 removes one or more binary symbols from the binary expressions after the transform in B-transform unit 110, and scans the binary expressions less the one or more binary symbols to generate a bitstream.

Encoder 120 may analyze the correlations between the binary symbols of the binary expressions to remove one or more binary symbols from the binary expressions, and scan the binary expressions less the one or more binary symbols in a raster scan direction or diagonally to generate the bitstream.

Here, the one or more binary symbols which are removed from the binary expressions may be the ones spanning from the last binary symbol back to a binary symbol at an i-th location within the binary expression generated from performing an i-th B-transform on a symbol sequence of the input data.

In addition, if the binary expression generated from the i-th B-transform on the input data symbol sequence has its j-th binary symbol valued '0', the one or more binary symbols removed from the binary expressions may be a (j−1)th binary symbol of a binary expression generated from an (i+1)th B-transform. In this case, encoder 120 may scan the binary expression at 135° for the diagonal direction.

In addition, if the binary expression generated from the i-th B-transform on the input data symbol sequence has its j-th binary symbol valued '1', the one or more binary symbols removed from the binary expressions may be a (j+1)th binary symbol of a binary expression generated from an (i−1)th B-transform. In this case, encoder 120 may scan the binary expression at −45° for the diagonal direction.

Further, encoder 120 may encode the number of '1's being read during the diagonal scanning to generate the bitstream. In this event, the encoding operation of the '1' count may be accomplished by determining the required bit number for the operation and through a binary expression of the '1' count in accordance with the determined bit number, where in the event that the binary expression for the '1' count has the most significant bit of '1', the bitstream may include the most significant bit only.

In the event that encoder 120 generates the bitstream by encoding the number of '1's being read during the diagonal scanning, it may determine the required bit number required for encoding of the number of '1's being and perform an encoding into the determined required bit number with respect to sort identifiers up to the ones having the number of '1's being greater than or equal to a threshold, while it may encode the sort identifiers starting to have the number of '1's being greater than or equal to the threshold, either into the determined bit count with respect to the sort identifier costing the maximum bit number or into the determined required bit number less one bit with respect to the remaining sort identifiers, additionally encoding the position of the sort identifier costing the maximum bit number.

Additionally, encoder 120 may determine a required bit number for encoding of the number of '1's; encode sort identifiers up to the sort identifiers having the number of '1's being greater than or equal to a threshold, into the determined required bit number; and encode the sort identifiers from subsequent to the sort identifiers starting to have the number of '1's being greater than or equal to the threshold, into the determined required bit number less one bit. At this time, if the sort identifier having the number of '1's being greater than or equal to the threshold comes last or close to the last of the sequence of the entire sort identifiers, the reducible bit count undesirably decreases, and therefore encoder 120 may adaptively determine either a forward direction or a backward direction in encoding the number of '1's.

In addition, the encoder determine the smaller one of the removed binary symbols from the binary expressions with the one or more binary symbols removed, as the most probable symbol (MPS).

In the following, a specific example of encoding binary expressions by using properties of the B-transform.

FIG. 2 is an exemplary diagram showing the properties by which input data is B-transformed and encoded according to the first aspect.

In Bubble-transform or B-transform, binary symbol set { } $\{\tilde{D}^i | 1 \leq i \leq M_X\}$ generated after $M_X$ times of consecutive B-transform of X is defined by the binary expression of X. Through the sets of $\{\tilde{D}^i\}$ it can be seen in FIG. 2 that there are properties 1 to 3 by which the binary expressions of X generated after B-transform may be effectively encoded.

$$\tilde{D}^i(j)=0 \ (n-i<j<n) \quad \text{[Equation 1]}$$

In Equation 1, n, i, and j are arbitrary integers, respectively.

Referring to FIG. 2, property 1 indicates for binary data symbol sequence X that it is possible to reduce the symbol count of the binary expression at each operation of B-transform. In other words, property 1 means an exemption of the encoding operation since the binary expressions always have value '0', if they are the ones spanning from the last symbol of the binary expressions back to a binary symbol at an i-th location within the binary expression generated from performing an i-th B-transform on the symbol sequence X of the input data, suggesting property 1 is for reducing the bit count of data to be encoded.

Property 2 represents that, if the binary expression from an i-th B-transform of the binary data symbol sequence X has its j-th binary symbol of '0', an (i+1)th B-transformed binary expression has its (j−1)th binary data symbol of '0'. It means that, in a table representation by the B-transform step count with respect to the respective binary symbols of the binary expressions from the B-transform of the input data symbol sequence, if there is a '0' binary symbol at an arbitrary location in the table, the remaining binary symbols are all '0' along a line extending down to a diagonal left-hand side from the binary symbol at that arbitrary position. Therefore, if the binary expression generated from an i-th B-transform of the input data symbol sequence has its j-th binary symbol of '0', it is possible to skip the (j−1)th binary data symbol of the binary expression generated from the (i+1)th B-transform among other binary expressions.

Property 3 represents that, if the binary expression from an i-th B-transform of the input data symbol sequence X has its j-th binary symbol of '1', an (i−1)th B-transformed binary expression has its (j+1)th binary data symbol of '1'. It means that, in a table representation by the B-transform step count with respect to the respective binary symbols of the binary expressions from the B-transform of the input data symbol sequence, if there is a '1' binary symbol at an arbitrary location in the table, the remaining binary symbols are all '1' along a line extending up to a diagonal right-hand side from the binary symbol at that arbitrary position. Therefore, if the binary expression generated from an i-th B-transform of the input data symbol sequence has its j-th binary symbol of '1', it is possible to skip the (j+1)th binary data symbol of the binary expression generated from the (i−1)th B-transform and so using property 3 may reduce the bits from the data to be encoded.

Figure 3:
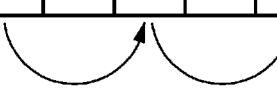
FIG. 3 is an exemplary diagram for describing the steps of generating binary expressions through the B-transform on the input data according to the first aspect.

FIG. 3 is an exemplary diagram for describing the steps of generating binary expressions through the B-transform on the input data according to the first aspect.

Assuming input data symbol sequence X is generated in a uniform distribution within population S={1, 2, . . . , 16} and is in the order of {2, 5, 3, 1, 11, 12, 15, 8, 7, 6, 16, 4, 9, 10, 14, 13}, it is possible to B-transform symbol sequence X as shown in FIG. 3.

In FIG. 3, X represents the symbol sequence of input data, $X_{(M1)}$ the symbol sequence of input data rearranged after first B-transform, $X_{(M2)}$ the symbol sequence of input data after first B-transform, $\{\tilde{D}^1\}$ the binary expression generated after the first B-transform, $\{\tilde{D}^2\}$ the binary expression generated after the second B-transform. As can be seen from FIG. 3, the number of binary symbols of the binary expressions generated by the respective B-transform is smaller than the number of symbol sequences of the input data by one.

It is described now the progress of the B-transform method with reference to FIG. 3. The respective symbols of the input data symbol sequences X are compared with the following symbols by turns and binary symbol '0' is outputted if two symbols are sorted in ascending order, and binary symbol '1' is outputted if they are not sorted in ascending order. In the event of outputting binary symbol '1', the order of the two symbols is reversed into the ascending order followed by next comparison of symbols with respect to the re-sorted symbol and the subsequent symbol.

For example, when performing a single B-transform of the input data symbol sequences X, a first symbol '2' and a second symbol '5' in the input data symbol sequence X are compared. At this time, since '2' and '5' are in ascending order, binary symbol '0' is outputted. Because of the binary symbol outputted as '0', the symbol positions are not switched. Therefore, the first symbol of $X_{(M2)}$ becomes '2'.

Subsequently, with no switching of the symbol positions, the second symbol '5' and third symbol '3' are compared. However, since '5' and '2' are not in ascending order, binary symbol '1' is outputted. Because of the binary symbol outputted as '1' in this case, the positions of symbols '5' and '3' are switched. Therefore, the second symbol of $X_{(M2)}$ becomes '3'. Next, because of the symbol positions switched, symbol '5' is compared with a fourth symbol '1' in a way to conditionally output binary symbols and accordingly switching their places depending on whether the sorting is in ascending order through the entire symbols, whereby completing the first B-transform. The same applies to a second B-transform and other respective events of B-transform.

FIG. 4 is an exemplary diagram showing a table formation by applying property 1 to the binary expressions generated from the B-transform according to the first aspect.

When performing eight events of B-transform of the input data symbol sequences X in the method described above and charting a table of binary expressions from the sequential B-transforms with an application of property 1, the diagram of FIG. 4 is obtained. Referring to FIG. 4, the total number of the binary symbols of the binary expressions generated after the first B-transform is 15, whereas the total number of the binary symbols of the binary expressions generated after the second B-transform is 14 and finally the total number of the binary symbols of the binary expressions generated after the last eighth B-transform is 8. Actually, although the total number of the binary symbols of the binary expressions is 15 regardless of the sequential B-transform step number or step count, because at the higher B-transform step count there are more binary symbols valued '0' in the reverse order from the last binary symbol, it is possible to predict the last binary symbols by the B-transform step count. Therefore, since some of binary symbols that may be generated from the B-transform can be predicted from property 1, those predictable binary symbols can forgo an encoding operation towards their reconstruction, thereby reducing the number of binary symbols to be encoded to effect a reduction in the bit count. In FIG. 4, $d_1$ to $d_{15}$ respectively represent the binary symbols generated from the B-transform on the input data symbol sequences and they may be generalized by $d_n$.

FIG. 5 is an exemplary diagram showing a table formation by applying property 2 to the binary expressions from the B-transform according to the first aspect.

When applying property 2 to the binary data shown in FIG. 4, the result can be seen as FIG. 5. According to property 2, if there is a '0' binary symbol at an arbitrary location in the table, the remaining binary symbols may be predicted to be all '0' along a line extending down to a diagonal left-hand side from the binary symbol at that arbitrary position. That is, it can be seen in the table of FIG. 4 that of the binary symbols along the same line extending diagonally from the top right side to the bottom left-hand side (for example, at 135°) the binary symbols are all '0' if they are subsequent to the first binary symbol to have '0' value.

Therefore, since the diagonally positioned binary symbols which are subsequent to the first binary symbol to be valued '0' may be predictably valued '0' and they may be omitted from the encoding operation, as shown in FIG. 5. In addition, those omissible binary symbols can be reconstructed needing no encoding operation and thereby reduce the number of binary symbols to be encoded and in turn the bit count.

FIG. 6 is an exemplary diagram showing a table formation by applying property 2 to the binary expressions from the B-transform followed by a diagonal scanning according to the first aspect.

The total number of binary symbols of the binary expressions as shown in FIG. 5, that is, the bit count may be fifty, and a sequential scanning may be performed on the binary symbols in the table in a raster scan direction to transmit the scanned bits in a bitstream, or as shown in FIG. 6, the binary symbols may be scanned diagonally at 135° to transmit the scanned bits in the bitstream, and an inverse scanning of the transmitted bitstream in the same manner will reconstruct the original binary expressions.

For example, in the event of scanning in the raster scan direction, the bitstream of the binary expressions shown in FIG. 5 may be {01100011101111101 111 11111111111010111110011000 111}. In addition, scanning diagonally as shown in FIG. 5 may make the bitstream of the binary expressions of FIG. 5 into {01011100011101111101111100111111111111101111101101 110}. When the encoding apparatus supplies the bitstream in this way, a decoding apparatus may have the received bitstream inversely scanned in the corresponding scan direction in order to reconstruct all of the symbols of the binary expressions.

Meanwhile, in the event of diagonal scan as in FIG. 6 with respect to the binary expressions of FIG. 5, a rule can be found such as Equation 2. That is, as shown in FIGS. 5 and 6, if n equals to or smaller than $M_X$, n is the maximum number (max_bit($d_n$)) of binary symbols or bits possible at location $d_n$. Additionally, if n is greater than $M_X$, it can be seen that the maximum number (max_bit($d_n$)) of bits possible at location $d_n$ (max_bit($d_n$)) is counted to be $M_X$.

$$\text{max\_bit}(d_n)=n,\ 1 \leq n \leq M_X$$

$$\text{max\_bit}(d_n)=M_X,\ M_X < n \leq N \quad \text{[Equation 2]}$$

max_bit(k) represents the maximum bits which can be generated at location k.

Further, in the event of diagonally scanning as in FIG. 6 with respect to the binary expressions of FIG. 5, an additional rule of Equation 3 can be found. That is, if binary symbols valued '0' are generated in the course of diagonally scanning by property 2, it is not necessary to read in further binary symbols located next in the diagonal direction for encoding. Not requiring the reading and encoding of the subsequent binary symbols in the encoding apparatus means that if a decoding apparatus could have the knowledge of the number of the binary symbols valued '1' among such symbols read in during a diagonal scanning from location $d_n$, it will reconstruct all of the binary expressions shown in FIG. 4.

Therefore, the encoding apparatus may encode the limited number of binary symbols valued '1' out of the binary symbols read in during the diagonal scanning, when the number of binary symbols (bit($d_n$)) which are valued '1' at every location $d_n$ may be calculated by Equation 3.

$$\text{bit}(d_n)=\text{Ceil}(\log_2(n))+1,\ 1 \leq n < M_X,$$

$$\text{bit}(d_n)=\text{Ceil}(\log_2(M_X))+1,\ M_X \leq n \leq N \quad \text{[Equation 3]}$$

In Equation 3, Ceil(x) is the largest integer among the numbers which are smaller than or equal to x.

FIG. 7 is an exemplary diagram showing the required bit count for encoding in the case of diagonally encoding the binary expressions from the B-transform according to the first aspect.

When applying Equation 3 to the exemplary input data symbol sequences (i.e. N is 16), the required bit count for encoding the number of binary symbols valued '1' at location $d_n(1 \leq n \leq 16)$ may be expressed as in FIG. 7. Referring to FIG. 7, the total bits required for encoding are forty nine.

To generalize such total bits (Total_bit$_{Prop}$(N)) for encoding beyond the N of 16 leads to Equation 4.

$$\text{Total\_bit}_{Prop}(N) = \sum_{k=1}^{Ceil(\log_2(N-1))} k \cdot 2^{k-1} + \\ (Ceil(\log_2(N-1))+1) \cdot (N - 2^{Ceil(\log_2(N-1))})$$

[Equation 4]

In equation 4, the left portion in the right side is the bit count for n within the range of $1 \leq n < 2^{Ceil(\log_2(N-1))}$, and the right portion in the right side is the bit count for n within the range of $2^{Ceil(\log_2(N-1))} \leq n < N$. If N is the length of the symbol sequence of the uniformly distributed random data and an encoding is performed by using various encoding techniques such as entropy technique, the total bit (Total_bit$_{Entropy}$(N)) may be obtained by Equation 5, for example. Though Equation 5 represents calculating the total bits in the case of encoding using the entropy encoding, different encoding techniques may lead to various equations for the total bits.

$$\text{Total\_bit}_{Entropy}(N) = (Ceil(\log_2(N-1))+1) \cdot N$$

[Equation 5]

Therefore, in the event of encoding the binary expressions generated from the B-transform, by using the diagonal scanning, the obtainable gain may be calculated through Equation 6.

$$\text{Gain} = \frac{(\text{Total\_bit}_{Prop}(N) - \text{Total\_bit}_{Entropy}(N))}{\text{Total\_bit}_{Entropy}(N)} \\ = \frac{\left( \sum_{k=1}^{Ceil(\log_2(N-1))} k \cdot 2^{k-1} - \\ (Ceil(\log_2(n-1))+1) \cdot 2^{Ceil(\log_2(N-1))} \right)}{(Ceil(\log_2(N-1))+1) \cdot N}$$

[Equation 6]

FIG. 8 is an exemplary diagram showing a binary expression for encoding the number of '1's being read during the diagonal scanning according to the first aspect.

When encoding the binary data exemplified in FIG. 2 in the method described through FIGS. 6 and 7 and Equations 2 to 6, an encoding may be performed as in the sequence of FIG. 8. Specifically, when calculating the bit count required for the encoding of the binary symbol value '1' at the respective $d_n$ of the binary data illustrated in FIG. 2 and calculating the number of '1's from the diagonal scanning at the respective $d_n$ followed by expressing the number of '1's with a binary conversion, a new binary expression is generated as shown in FIG. 8.

Referring to FIG. 8, since the required bit count for encoding the number of '1's at $d_1$ is calculated by Equation 3 to be 1 and the number of '1's in a diagonal scanning at $d_1$ is 0, the binary expression for encoding the same is expressed as '1'. In addition, the required bit count for encoding the number of '1's at $d_2$ is calculated by Equation 3 to be 2 and the number of '1's in a diagonal scanning at $d_2$ is 1, and hence the binary expression for encoding the same is expressed as '01'. In addition, the required bit count for encoding the number of '1's at $d_7$ is calculated by Equation 3 to be 3 and the number of '1's in a diagonal scanning at $d_7$ is 3, and hence the binary expression for encoding the same is expressed as '011'. Encoding from $d_1$ to $d_{15}$ in this way generates the binary expression as in FIG. 8. Therefore, the result of the above encoding may be the symbol sequence X generated as uniformly distributed data, which is encoded and expressed as bitstream {1011100000000001101000101000010000100010000100 011}.

As described above, after calculating the number of '1's from the diagonal scanning at the respective $d_n$ followed encoding the number of '1's with the binary conversion, information on $M_x$ may be used to further remove bits as will be described. That is, with $M_x$ representing the step count of the B-transform, because the number of '1's at the respective $d_n$ cannot be greater than $M_x$, it is possible to remove bits partially from $d_{2^{Ceil(\log_2(N-1))}}$ to $d_N$.

For example, $M_x$ in the binary expression shown in FIG. 4 is 8 and so its binary conversion is '1000'. According to Equation 2, because the number of '1's at $d_n$ cannot be greater than or must be smaller than or equal to $M_x$ and remains to be same from $d_8$ to $d_{15}$, it may have values from '0000' to '1000'. In the case of $d_{11}$, '1' is counted 8 and so it may be indicated as '1000'. Here, since the maximum value of $M_x$ is '1000', if the most significant bit or MSB is '1', the total four bits minus MSB will leave the remaining three bits of '000'. Therefore, upon receiving MSB the decoding apparatus does not need to receive the remaining three bits of '000' to know the number of the original events of '1' and is capable of reconstructing the resultant binary symbol. For this reason, it is not necessary for the encoding apparatus to transmit the remaining three bits of '000' by which the compression advances.

FIG. 9 is an exemplary diagram showing the bit number available for reduction by using a step count according to the first aspect.

To orderly generalize the described examples to a case where N is 16 and $M_x$ is equal to or greater than 8, FIG. 9 may be charted. Specifically, for $d_n$ where '1' is counted to be $M_x$, a bit reduction can be achieved as in FIG. 9. For example, if $M_x$ is 9, $d_n$ where '1' is counted 9 may be expressed with an omission of '00' from the original binary expression '1001' into '11', which reduces two bits.

As described, by using the rule that the number of '1's at $d_n$ cannot be greater than $M_x$, up to three bits from 0 bit can be reduced per sort identifier ($d_n$). Such method is not limited to the example illustrated in FIG. 9 but is applicable to all the symbols located at $d_{2^{Ceil(\log_2(N-1))}}$ through $d_N$.

As an alternative to this, it is possible to omit the binary expression symbols from the binary numerical expression of the number of '1's which will be described. In particular, when N is small (for example, N<64), off the locations from $d_{2^{Ceil(\log_2(N-1))}}$ to $d_N$ there are few of $d_N$ that has '1' counted greater than or equal to $2^{Ceil(\log_2(N-1))}$. In the illustration of FIG. 7, $d_{11}$ out of $d_8$~$d_{15}$ is the only occasion that has '1' counted greater than or equal to 8. Therefore, removing $d_{11}$ from actual $d_8$~$d_{15}$ allows the number of '1's to be sufficiently expressed with three bits. However, the decoding apparatus needs encoding of information on the removal of $d_{11}$ from actual $d_8$~$d_{15}$ and the resultant capability of the three-bit expression, which is achieved in two methods.

The first method is to encode the location $d_{11}$. For example, the total 8 of locations $d_8$~$d_{15}$ may be completely expressed in thee bits. Therefore, when expressing $d_8$ as a reference point by '000', location $d_{11}$ may be expressed by '100. The decoding apparatus may use this location to decode $d_8$, $d_9$, $d_{10}$, $d_{12}$, $d_{13}$, $d_{14}$, $d_{15}$ with only three bits but decode just $d_{11}$ with four bits. In this occasion, although extra three bits are needed for indicating the location, the incidental reduction of seven bits allows omission of four bits in total. However, if there are multiple occasions of $d_n$ numbered 8 or more, the required bits for encoding the actual locations might outnumber the bits of the incidental reduction.

In other words, assuming a generated symbol sequence X of length N underwent the B-transform and a diagonal scanning is performed through binary data, i.e. from $d_1$ to $d_{N-1}$ to encode the number of '1's, there occurs a section involving a common bit count used wherein sort identifiers $d_n$ are encoded by the same bit count and so, when there are number K of d as illustrated in FIG. 7 where $d_8$~$d_{15}$ can commonly use four bits to express the number of '1's and the number of d in this section is 8 or K=8, it is necessary to have T bits for expressing the location of a particular d from the number K of d. T may be calculated by using Equation 7.

$$T = \text{Ceil}(\log_2(K-1)) + 1 \quad \text{[Equation 7]}$$

Additionally, assuming n locations of K locations are to be expressed, the necessary bits are nT. The remaining locations except this are K-n for each of which locations one bit may be reduced. For the bit reduction, Equation 8 should be satisfied.

$$nT < k - n \quad \text{[Equation 8]}$$

$$n < \frac{K}{T+1}$$

$$n < \frac{K}{\text{Ceil}(\log_2(K-1)) + 2}, n \text{ is a natural number.}$$

FIG. 10 is an exemplary diagram showing a condition for reducing bits in encoding a sort identifier costing the maximum bit number according to the first aspect.

Organizing Equation 8 about K, and obtaining and presenting n that satisfies Equation 8 lead to FIG. 10. As it shows, the larger the K, the larger the n is and the smaller the n, the greater the bit count is entitled to reduction. However, there is a need for additional information to transmit for encoding the number of n.

An alternative method is to transmit just the number of $d_n$ having a greater or equal number of '1's relative to $2^{\text{Ceil}(\log_2(N-1))}$, continue transmitting every bit up to $d_n$ having a greater or equal number of '1's relative to $2^{\text{Ceil}(\log_2(N-1))}$, and transmit one bit less respectively from the subsequent bits. Again, assuming $d_8$~$d_{15}$ are to be encoded in the example of FIG. 7, only $d_{11}$ is present as $d_n$ having a greater or equal number of '1's relative to $2^{\text{Ceil}(\log_2(N-1))}$ and thus the number of $d_n$ is 1. After encoding '1', actual data is orderly transmitted. Specifically, $d_8$ as '0100', $d_9$ as '0101', $d_{10}$ as '0000', and $d_{11}$ as '1000' are transmitted. Because $d_{11}$ is greater than or equal to '8', that is, $2^{\text{Ceil}(\log_2(N-1))}$ equals to '8' for N being 16, $d_{12}$ and later may be recognized as being smaller than '7' and are encodable with only three bits. Therefore, $d_{12}$ may be encoded into '100', $d_{13}$ into '100', and $d_{14}$ into '010', saving the total of three bits.

However, an issue with the alternative method is that depending on the location $d_n$ having a greater or equal number of '1's relative to $2^{\text{Ceil}(\log_2(N-1))}$, the degree of reducing bit count changes very much. If the location $d_n$ having a greater or equal number of '1's relative to $2^{\text{Ceil}(\log_2(N-1))}$ occurs earlier in the encoding sequence or transmission sequence, the bits to reduce are many, but if it occurs later in the sequence, the smaller bits may be reduced and there will be no bit to save at the end location.

Therefore, a backward search may be used in order to solve the inefficiency by the inability to reduce the bits when the location $d_n$ having a greater or equal number of '1's relative to $2^{\text{Ceil}(\log_2(N-1))}$ occurs later in the encoding sequence. An example is to perform encoding or transmission in the order of $d_{15}$, $d_{14}$, $d_{13}$, ..., $d_8$. In the case, there is need of an additional bit to be transmitted for indicating forward and backward searches. Here, the forward search means encoding in the order of $d_8$, $d_9$, $d_{10}$, ..., $d_{15}$ for the location $d_n$ having a greater or equal number of '1's relative to $2^{\text{Ceil}(\log_2(N-1))}$, and the backward search means encoding in the order of $d_{15}$, $d_{14}$, $d_{13}$, ..., $d_8$.

To generalize the encoding events in the alternative method, assuming a generated symbol sequence X of length N underwent the B-transform and a diagonal scanning is performed through binary expressions, i.e. from $d_1$ to $d_{N-1}$ to encode the number of there occurs a section involving a common bit count used wherein sort identifiers $d_n$ use the same bit count, and it is defined that there are number K of d as illustrated in FIG. 7 where $d_{8\sim d15}$ can commonly use four bits to express the number of '1's and the number of d in this section is 8 or K=8, and it is assumed that there remains only one $d_n$ having a greater or equal number of '1's relative to $2^{\text{Ceil}(\log_2(N-1))}$. Under this assumption, when performing just the forward search, the reducible bit count $\text{Bit}_{Right}$ may be obtained by using Equation 9.

$$\text{Bit}_{Right} = E[K - n] \quad \text{[Equation 9]}$$
$$= K - E[n]$$
$$= \frac{K}{2} - \frac{1}{2}$$

In Equation 9, n is assumed to have a uniform distribution.

In addition, if the forward search and the backward search are performed adaptively, the reducible bit count $\text{Bit}_{Right}$ may be obtained by using Equation 10.

$$\text{Bit}_{Adaptive} = K - \frac{1 + K/2}{2} - 1 \quad \text{[Equation 10]}$$
$$= \frac{3}{4}K - \frac{1}{2}$$

Comparing between Equation 9 and Equation 10, adaptively selecting the search direction can reduce more bits as K increases.

The described aspects are based on the method of using property 2 in deleting '0' in the diagonal direction and counting the events of '1'. In the present disclosure, bit reduction is possible by using property 3 as well as property 2.

FIG. 11 is an exemplary diagram showing a table formation by applying property 3 to the binary expressions from the B-transform according to the first aspect.

Applying property 3 to the table of FIG. 4 illustrating the binary expressions from the B-transform on input data symbol sequence may lead to the illustration of FIG. 11. In order to transmit the binary symbols, that is, bits shown in FIG. 11, the scanning may either start from the bottom row at left and progress sequentially in the raster scan direction to perform the encoding and transmission or it may start from the binary symbol at upper left and progress diagonally at −45° to perform the encoding and transmission as shown in FIG. 12.

FIG. 12 is an exemplary diagram showing a table formation by applying a property 3 to the binary expressions from the B-transform followed by a diagonal scanning according to the first aspect.

In the event of applying property 3 to a generated binary expression from the B-transform and scanning bits diagonally at −45° as in FIG. 12, a rule can be found such as Equation 2 as with the case of applying property 2. That is, if n equals to or smaller than $M_x$, n is the maximum number $(\max\_bit(d_n))$ of bits possible at location $d_n$. Additionally, if n is greater than $M_x$, it can be seen that the maximum number (max_bit($d_n$)) of bits possible at location $d_n$(max_bit($d_n$)) is counted to be $M_X$. Further, if '1' is generated in the course of diagonally scanning bits by property 3, since the next binary symbol is '1', it needs no encoding. This means that if the decoding apparatus could have the knowledge of the number of the binary symbols valued '0' among such symbols read in during a diagonal scanning from location $d_n$, it would reconstruct all of the binary data shown in FIG. 4.

Therefore, when compared, the case of diagonally scanning and encoding binary symbols by property 3 is characteristically identical to doing the same by property 2 except that the number of '1's is switched to the number of '0's. Therefore, the same description about the method of diagonally scanning and encoding binary symbols by property 2 may be similarly applied to a method with property 3.

As in the first aspect of the present disclosure, encoding is first performed on the binary expression generated from B-transforming the input data symbol sequence X, and the maximum probable symbol reverse flag (RF) is determined. In determining the maximum probable symbol, conventional methods analyzes, among the binary expressions from the B-transform, the distribution of the binary symbols retaining '0' and '1' to determine the highly distributed symbol as the maximum probable symbol. That is, if there are more events of '0', the maximum probable symbol is determined to be '0', and '1' for more of '1'. In contrast, the present disclosure does not depend on the distributions of '0' and '1' for determining the maximum probable symbol but uses property 2 and property 3 in encoding to reduce the bits first and determines the less frequent bit between '0' and '1' as the maximum probable symbol.

Likewise, as for the reverse flag, both the forward search and backward search are completed first and the side in which the final output bits are the minimum is determined as the reverse flag. For example, if the bits outputted after the forward search are the minimum, the determination may be '0' and, if the bits outputted after the backward search are the minimum, the determination may be '1'.

Meanwhile, encoder 120 of encoding apparatus 100 may encode the input data to generate encoded data, which comprises a step count field containing a B-transform step count and a data field containing a bitstream generated by removing at least one binary symbol from and performing a scanning with respect to a binary expression generated from B-transforming the input data as much as the B-transform step count.

In addition, the encoded data may also contain the maximum probable symbol field containing a flag for indicating the maximum probable symbol, wherein the maximum probable symbol may be the lesser of the binary symbols of the binary expression with the one or more binary symbols removed. In addition, the encoded data may also contain the reverse flag field which includes a flag for indicating whether there is the backward search or not.

Figure 13:
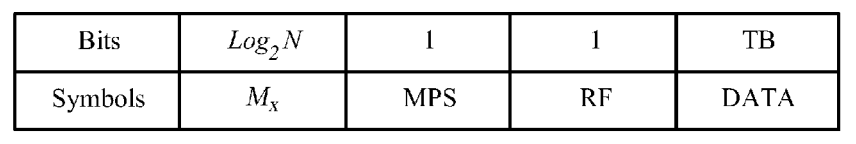

FIG. 13 is an exemplary diagram showing the structure of an encoded data by encoding the binary expressions from the B-transform according to the first aspect.

The previously described structure of the encoded data may be illustrated as FIG. 13. $M_x$ represents the step count of the B-transform, and the maximum probable symbol represents the more frequent binary symbol between binary symbols 0 and 1 generated from the B-transform, whereby determining the sequence of encoding the binary data. In the present disclosure, rather than relating to the binary symbol distribution in determining the maximum probable symbol, property 2 and property 3 are applied according to the first aspect for reducing the bits and then determining the less frequent symbol as the maximum probable symbol.

The reverse flag is a flag for identifying which smaller one was selectively used between two transforming step count Mx and MX' of generated symbol sequence X={x1, x2, ..., xN} and its reversed new symbol sequence X'={xN, xN−1, ..., x1}. In the present disclosure, the reverse flag represents one side between the forward search and backward search which results in minimum outputted bits. In the structure of an encoded data shown in FIG. 12, the compressible field by encoding with properties 1 through 3 is a data field.

Figure 14:
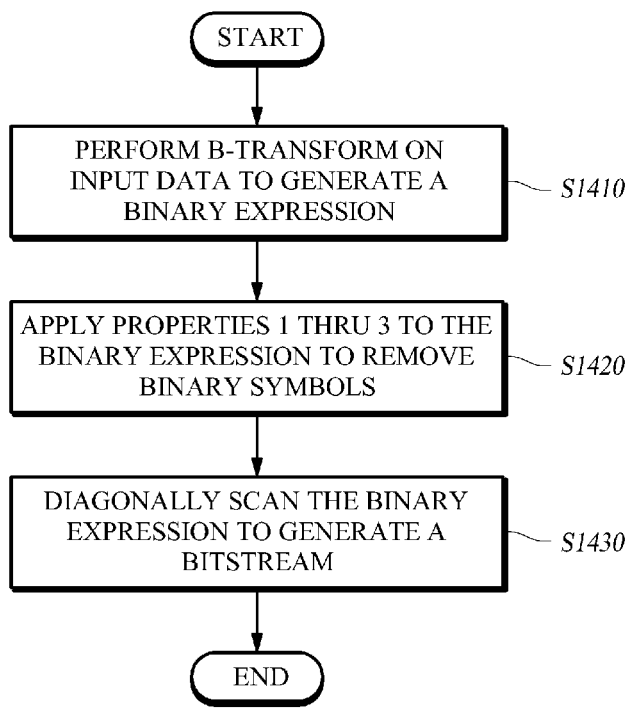
FIG. 14 is a flow diagram for describing an encoding method according to a first aspect.

FIG. 14 is a flow diagram for describing an encoding method according to a first aspect.

Encoding apparatus 100 performs B-transform on symbol sequences of input data to generate a binary expression in step S1410, applies properties 1 through 3 to the binary expression to remove at least one binary symbols from the binary expression in step S1420, and scan the respective binary symbols of the binary expression with the at least one binary symbols removed, in a raster scanning direction or diagonal direction to generate a bitstream in step S1430. Such generated bitstream may be combined with a step count or combined with one or more of the step count, a maximum probable symbol, and an inverse flag and thereby be formed into encoded data for transmission to a decoding apparatus. In addition, encoding apparatus 100, when diagonally scanning the respective binary symbols of the binary expression with the at least one binary symbols removed and generating the bitstream, may further reduce the bits by using the various techniques described through FIGS. 4 to 11.

Figure 15:
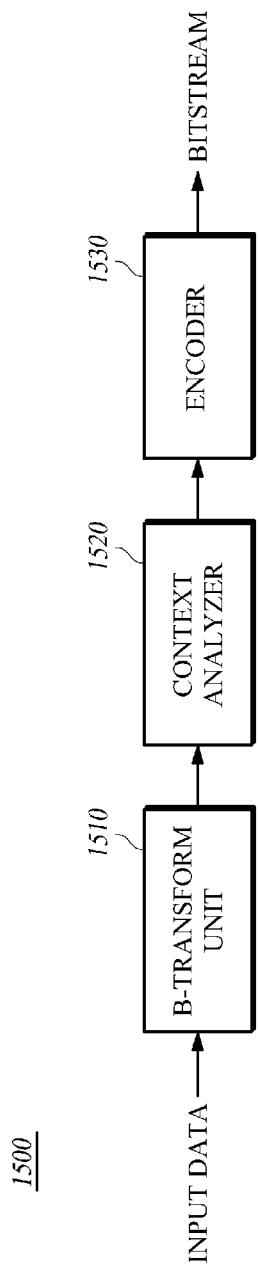
FIG. 15 is a block diagram of a context based encoding apparatus of a second aspect.

FIG. 15 is a block diagram of the construction of a context based encoding apparatus 1500 of a second aspect.

Context based encoding apparatus 1500 of the second aspect may comprise a B-transform unit 1510, a context analyzer 1520, and an encoder 1530. Such context based encoding apparatus 1500 may be a subordinate device or a subordinate software module for compressing data within a personal computer or PC, notebook or laptop computer, personal portable terminal such as personal digital assistant or PDA, portable multimedia player or PMP, PlayStation Portable or PSP, or mobile communication terminal, or such various devices for encoding data, and may be a variety of apparatuses equipped with, for example, a communicating interface for carrying out communications with various instruments, parts, software modules, or wired/wireless communication networks, a memory for storing various video encoding programs and data, and a microprocessor for executing the programs to effect computations and controls.

B-transform unit 1510, in response to an input of uniform distribution data as input data, transforms the same data into binary symbols to generate data in binary symbol expression and deliver the data to context analyzer 1520. Here, the binary symbol means a symbol having the value of '0' or '1'.

Context analyzer 1520 analyzes the correlation between samples of data in binary symbol expression by B-transform unit 1510 to determine the context of the samples and notify the same to encoder 1530. Here, context analyzer 1520, in analyzing the correlation between samples of data in binary symbol expression, may use a table indicating the samples in binary symbol expression.

A nonlinear B-transform expresses the presence or absence of an uncertainty among the uniform distribution data by the binary symbol of '0' or '1', and the expression on the presence of the uncertainty may change depending on the depths of transform. In FIG. 16, a table is illustrated for presenting the binary expressions from the B-transform. When performing the nonlinear B-transform on 16 data inputs, binary expressions having binary symbols of '0' or '1' are generated. Rendering the transformed binary expressions by the depths of B-transform generates the table of FIG. 16. In the table of FIG. 16, $l_1$ through $l_8$ represent the depths (levels) of transform, and $d_1$ through $d_{16}$ represent the presence or absence of the uncertainty among the uniform distribution data.

Referring to FIG. 16, it can be seen that the binary expressions obtained by the nonlinear B-transform are variably presented depending on the presence or absence of the uncertainty among the uniform distribution data and by the depths of the nonlinear B-transform. In addition, as shown in FIG. 16, due to the characteristics of the nonlinear B-transform, the presence or absence of the uncertainty at an arbitrary has a correlation in a diagonal direction. That is, in FIG. 16, samples having value '1' for identifying the presence of uncertainty are shown adjoined diagonally by samples having the same value '1' especially at the right hand side. Therefore, context analyzer 1520 uses this correlation to determine the context of the samples.

To this end, context analyzer 1520 may select an arbitrary sample to determine the context from the table that presents the samples in binary symbol expression shown in FIG. 16, detect the binary symbols of the samples with a diagonal adjacency to the selected sample, and determine the detected binary symbol as the context of the selected sample.

Here, the diagonally adjacent samples may be the samples on the upper right of the selected sample in the table, and the selection of samples may be in order in the raster scanning direction. The reason for limitedly detecting the samples on the upper right of the selected sample rather than detecting binary symbols of all of the diagonally adjacent samples in determining the context, is because samples on the lower left of the selected sample are yet to be encoded and cannot provide a base on which the decoders decode the currently selected sample as they operate on received bitstreams only. Therefore, context analyzer 1520 determines the context of the selected sample by considering just the binary symbols of the upper right samples of the selected sample from the diagonally correlated samples not the binary symbols of the lower left samples.

For example, in FIG. 16, if the selected sample is located at coordinate $(l_2, d_6)$, binary symbol '1' of the sample located at upper right coordinate $(l_1, d_7)$ of coordinate $(l_2, d_6)$ becomes the context of the selected sample. For another example, if the selected sample is located at coordinate $(l_3, d_{10})$, binary symbol '1' of the sample located at upper right coordinate $(l_2, d_{11})$ of coordinate $(l_3, d_{10})$ becomes the context of the selected sample.

Encoder 1530 encodes samples according to the context determined by context analyzer 1520 to generate a bitstream. Specifically, encoder 1530 responds to the supply of sample context from context analyzer 1520 to correspondingly update the probability table for encoding and use the updated probability table to encode the corresponding sample.

The description with FIG. 15 refers to B-transform unit 1510 as a requisite for B-transforming input data to generate the data in binary symbol expression. However, context based encoding apparatus 1500 may not necessarily include B-transform unit 1510, wherein context analyzer 1520 may directly receive at its input the data in binary symbol expression from the B-transform already performed on the input data.

Figure 17:
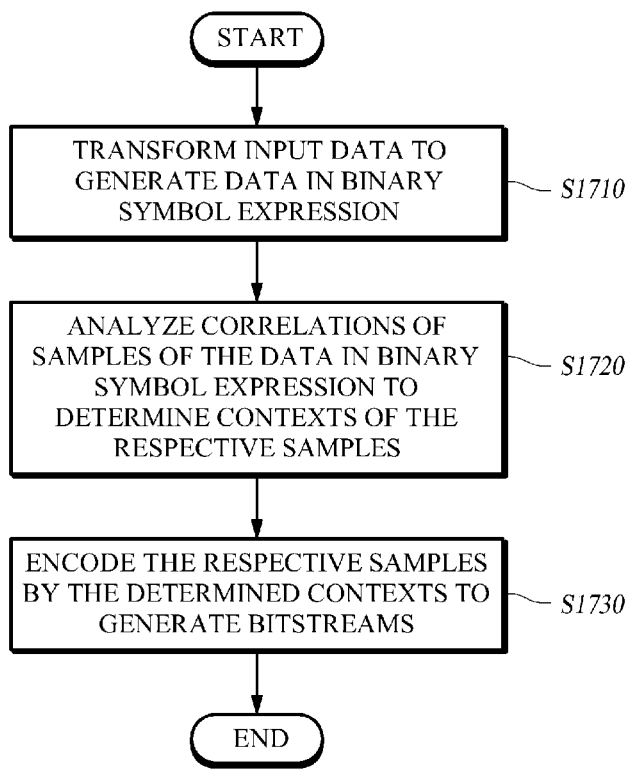
FIG. 17 is a flow diagram for describing a context based encoding method according to a second aspect.

FIG. 17 is a flow diagram for describing a context based encoding method according to a second aspect.

Context based encoding apparatus 1500 performs the B-transform on input data upon receipt to have the binary symbol expression of the data transformed in step S1710, and analyzes correlations of samples of the data in binary symbol expression to determine contexts of the respective samples in step S1720. Once the contexts of the respective samples are determined, context based encoding apparatus 1500 encodes the respective samples by the determined contexts to generate bitstreams in step S1730. At this time, context based encoding apparatus 1500 updates a probability table for the encoding at every determination of the context of the respective samples, and encodes the corresponding sample using the updated probability table.

Here, step S1710 may not be necessarily carried out. In other words, context based encoding apparatus 1500 may forgo step S1710 when it does not receive uniform distribution data as input data and instead receives the data in binary symbol expression from the B-transform of the uniform distribution data.

Alternatively, context based encoding apparatus 1500, in step S1720 for determining the contexts of the respective samples, may perform as will be described with reference to FIG. 18.

Figure 18:
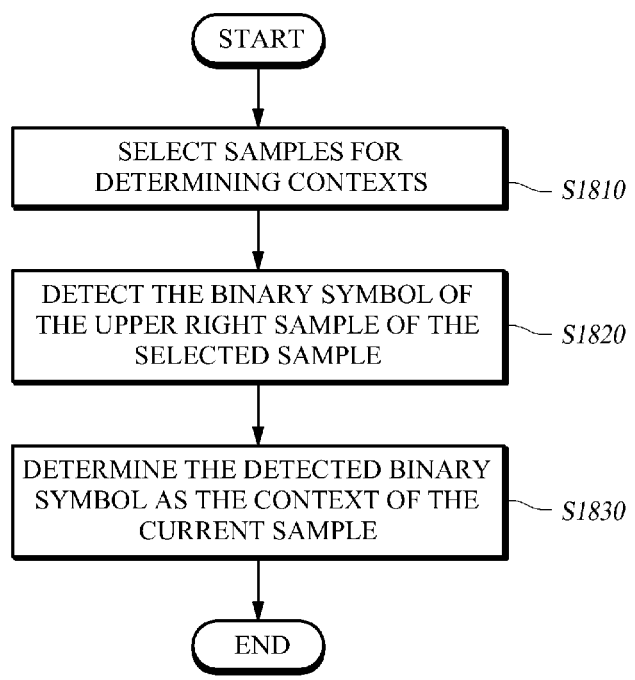
FIG. 18 is an exemplary diagram showing the steps of making context decision according to the second aspect.

FIG. 18 is an exemplary diagram showing the steps of making context decision according to the second aspect.

When the data in binary symbol expression is configured to a table as illustrated in FIG. 16, context based encoding apparatus 1500 selects arbitrary samples for determining the contexts from the upper left one in the table singly and sequentially in the raster scanning direction in step S1810.

Upon selecting the arbitrary samples for determining the contexts, context based encoding apparatus 1500 detects the binary symbol of the upper right sample of the selected sample in step S1820. If such upper right sample is absent, no determination is made on the context, and thereby step S1730 described in FIG. 17 for encoding the corresponding sample may proceed to encode the sample without updating the probability table. In addition, context based encoding apparatus 1500 may determine the context of the selected sample with just the binary symbols of the upper right samples considered among the diagonally correlated samples but ignoring binary symbols of the lower left samples.

Upon detecting a binary symbol, context based encoding apparatus 1500 determines the detected binary symbol as the context of the selected sample in step S1830.

Context analyzer 1520 of context based encoding apparatus 1500 according to the second aspect may be independently implemented as a context analyzing apparatus for encoding according to a third aspect. In this case, the context analyzing apparatus of the third aspect may select a sample for determining the context from a table for presenting samples in binary symbol expression from uniform distribution data, detects the binary symbol of an upper right sample of the selected sample in the table, and determine the detected binary symbol as the context of the selected sample.

In the description above, although all of the components of the embodiments of the present disclosure may have been explained as assembled or operatively connected as a unit, the present disclosure is not intended to limit itself to such embodiments. Rather, within the objective scope of the present disclosure, the respective components may be selectively and operatively combined in any numbers. Every one of the components may be also implemented by itself in hardware while the respective ones can be combined in part or as a whole selectively and implemented in a computer program having program modules for executing functions of the hardware equivalents. Codes or code segments to constitute such a program may be easily deduced by a person skilled in the art. The computer program may be stored in computer readable media, which in operation can realize the embodiments of the present disclosure. As the computer readable media, the candidates include magnetic recording media, optical recording media, and carrier wave media.

In addition, terms like 'include', 'comprise', and 'have' should be interpreted in default as inclusive or open rather than exclusive or closed unless expressly defined to the contrary. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although exemplary embodiments of the present disclosure have been described for illustrative purposes, those skilled in the art will appreciate that various modifications, additions and substitutions are possible, without departing from essential characteristics of the disclosure. Therefore, exemplary embodiments of the present disclosure have not been described for limiting purposes. Accordingly, the scope of the disclosure is not to be limited by the above embodiments but by the claims and the equivalents thereof.

INDUSTRIAL APPLICABILITY

As described above, the present disclosure is highly useful for application in compressing data, wherein a context decision may be made by using the B-transform characteristics that the samples in binary expression generated by the nonlinear B-transform on the uniform distribution data involve a correlation between the diagonally positioned samples, whereby giving a more accurate context decision and accordingly an accurate update of the probability table for compressing the uniform distribution data with an increased compression efficiency, and using the B-transform by its characteristics for reducing the bit number in the generation of the binary expressions from the B-transform operation on the uniform distribution data enhances the data compression performance, obviating an extra computation so as to simplify the implementation of an encoding apparatus.

The invention claimed is:

1. An apparatus for encoding input data comprising:
a B-transform unit for performing a B-transform on the input data to generate a binary expression; and
an encoder for removing one or more binary symbols from the binary expression and scanning the binary expression with the one or more binary symbols removed to generate a bitstream.

2. The apparatus of claim 1, wherein the encoder removes the one or more binary symbols by analyzing correlation between the binary symbols of the binary symbols of the binary expression.

3. The apparatus of claim 1, wherein the one or more binary symbols are binary symbols spanning from a last binary symbol back to a binary symbol at an i-th location within a binary expression generated from performing an i-th B-transform on a symbol sequence of the input data.

4. The apparatus of claim 1, wherein the encoder sequentially scans the binary expression with the one or more binary symbols removed, in a diagonal direction.

5. The apparatus of claim 4, wherein if a j-th binary symbol of a binary expression generated from an i-th B-transform on a symbol sequence of the input data has value '0', the one or more binary symbols are a (j−1)th binary symbol of a binary expression generated from an (i+1)th B-transform.

6. The apparatus of claim 5, wherein the diagonal direction is at 135°.

7. The apparatus of claim 4, wherein if a j-th binary symbol of a binary expression generated from an i-th B-transform on a symbol sequence of the input data has value '1', the one or more binary symbols are a (j+1)th binary symbol of a binary expression generated from an (i−1)th B-transform.

8. The apparatus of claim 5, wherein the diagonal direction is at −45°.

9. The apparatus of claim 1, wherein the encoder generates the bitstream by encoding the number of '1's being read during the diagonal direction of scanning.

10. The apparatus of claim 9, wherein the encoder encodes the number of '1's by determining a required bit number for encoding the number of '1' and through a binary expression of the number of '1's in accordance with a determined required bit number.

11. The apparatus of claim 10, wherein the encoder incorporates only a most significant bit into the bitstream, if the binary expression of the number of '1's has the most significant bit of '1'.

12. The apparatus of claim 9, wherein encoder determines a required bit number for encoding of the number of '1's; encodes sort identifiers up to the sort identifiers having the number of '1's greater than or equal to a threshold into a determined required bit number; and encodes the sort identifiers starting to have the '1' count greater than or equal to the threshold either into the determined required bit number with respect to the sort identifier costing a maximum bit number or into the determined required bit number less one bit with respect to remaining sort identifiers, additionally encoding a position of the sort identifier costing the maximum bit number.

13. The apparatus of claim 9, wherein encoder determines a required bit number for encoding of the number of '1's; encodes sort identifiers up to the sort identifiers having the number of '1's being greater than or equal to a threshold into a determined required bit number; and encodes the sort identifiers from subsequent to the sort identifiers starting to have the number of '1's being greater than or equal to the threshold into the determined required bit number less one bit.

14. The apparatus of claim 13, wherein the encoder adaptively determines either a forward direction or a backward direction in encoding the number of '1'.

15. The apparatus of claim 1, wherein among the binary symbols of the binary expression with the one or more binary symbols removed, the encoder determines a less frequent symbol as a maximum probable symbol.

16. The apparatus of claim 1, wherein the input data is uniform distribution data.

17. A method for encoding input data comprising:
performing a B-transform on the input data to generate a binary expression; and
performing an encoding by removing one or more binary symbols from the binary expression and scanning the binary expression with the one or more binary symbols removed to generate a bitstream.

18. Encoded data generated from encoding input data by an encoding apparatus, the encoded data comprising: a step count field containing a B-transform step count; and a data field containing a bitstream generated by removing one or more binary symbols from and performing a scanning with respect to a binary expression generated from B-transforming the input data as much as the B-transform step count.

19. The encoded data of claim 18, further comprising a maximum probable symbol field containing a flag for indicating a maximum probable symbol.

20. The encoded data of claim 19, wherein the maximum probable symbol is the lesser of binary symbols of the binary expression with the one or more binary symbols removed.

21. The encoded data of claim 18, further comprising the reverse flag field containing a flag for indicating whether there is a backward search or not.

22. An apparatus for encoding input data based on contexts comprising:
- a context analyzer for analyzing a correlation between samples of data in binary symbol expression from the input data being transformed to determine a context of the samples;
- an encoder for encoding the samples according to the context determined to generate a bitstream; and
- a B-transform unit for transforming uniform distribution data upon receipt as the input data into binary symbols to generate the data in binary symbol expression.

23. The apparatus of claim 22, wherein the context analyzer analyzes the correlation by using a table for representing the samples in binary symbol expression.

24. The apparatus of claim 23, wherein the context analyzer selects a sample for determining the context from the table, detects a binary symbol of a sample adjoined diagonally by the sample selected in the table, and determines the binary symbol detected, as a context of the sample selected.

25. The apparatus of claim 22, wherein the context analyzer determines a binary symbol of an upper right sample of the sample selected as the context of the sample selected.

26. The apparatus of claim 22, wherein the context analyzer selects the sample sequentially in a raster scanning direction.

27. A method for analyzing a context for encoding comprising: selecting a sample for determining the context from a table representing samples in binary symbol expression from uniform distribution data; detecting a binary symbol of an upper right sample of the sample selected in the table; and determining the binary symbol detected, as a context of the sample selected.

28. A method for encoding input data based on contexts comprising:
- analyzing a context by analyzing a correlation between samples of data in binary symbol expression from the input data being transformed to determine a context of the samples; and
- encoding the samples according to the context determined to generate a bitstream,
- wherein the step of analyzing the context comprising:
- selecting a sample for determining the context from a table representing the samples in binary symbol expression;
- detecting a binary symbol of an upper right sample of the sample selected in the table; and
- determining the binary symbol detected, as a context of the sample selected.

29. The method of claim 28, further comprising performing a B-transform for transforming uniform distribution data upon receipt as the input data into binary symbols to generate the data in binary symbol expression.

30. An apparatus for analyzing a context for encoding by selecting a sample for determining the context from a table representing samples in binary symbol expression from uniform distribution data, detecting a binary symbol of an upper right sample of the sample selected in the table, and determining the binary symbol detected, as a context of the sample selected.

* * * * *